(12) United States Patent  (10) Patent No.: US 7,298,031 B1
Jiang et al.  (45) Date of Patent: Nov. 20, 2007

(54) MULTIPLE SUBSTRATE MICROELECTRONIC DEVICES AND METHODS OF MANUFACTURE

(75) Inventors: Tongbi Jiang, Boise, ID (US); J. Michael Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 825 days.

(21) Appl. No.: 09/634,056

(22) Filed: Aug. 9, 2000

(51) Int. Cl.
*H01L 23/02* (2006.01)

(52) U.S. Cl. ............. 257/686; 257/777; 257/782; 257/785

(58) Field of Classification Search ....... 257/777–782, 257/784–785, 787, 789, 686, 723, 737–738, 257/666, 792, 684; 438/107–109
See application file for complete search history.

(56) References Cited

U.S. PATENT DOCUMENTS

| | | | |
|---|---|---|---|
| 5,128,831 A | 7/1992 | Fox, III et al. | |
| 5,222,014 A | 6/1993 | Lin | |
| 5,252,857 A | 10/1993 | Kane et al. | |
| 5,323,060 A | 6/1994 | Fogal et al. | |
| 5,594,275 A | 1/1997 | Kwon et al. | |
| 5,646,831 A * | 7/1997 | Manteghi | 361/813 |
| 5,776,797 A | 7/1998 | Nicewarner, Jr. et al. | |
| 5,793,101 A | 8/1998 | Kuhn | |
| 5,815,372 A * | 9/1998 | Gallas | 361/760 |
| 5,883,426 A | 3/1999 | Tokuno et al. | |
| 5,917,242 A * | 6/1999 | Ball | 257/737 |
| 5,946,553 A | 8/1999 | Wood et al. | |
| 5,986,209 A | 11/1999 | Tandy | |
| 5,990,566 A | 11/1999 | Farnworth et al. | |
| 6,013,948 A * | 1/2000 | Akram et al. | 257/698 |
| 6,020,624 A | 2/2000 | Wood et al. | |
| 6,020,629 A | 2/2000 | Farnworth et al. | |
| 6,028,365 A | 2/2000 | Akram et al. | |
| 6,040,046 A * | 3/2000 | Ghiam et al. | 428/343 |
| 6,051,878 A | 4/2000 | Akram et al. | |
| 6,072,233 A | 6/2000 | Corisis et al. | |
| 6,072,236 A | 6/2000 | Akram et al. | |

(Continued)

FOREIGN PATENT DOCUMENTS

KR  2003047403 A  6/2003

OTHER PUBLICATIONS

U.S. Appl. No. 09/644,766, Corisis, David J.

(Continued)

*Primary Examiner*—Mary Wilczewski
*Assistant Examiner*—Thanh Y. Tran
(74) *Attorney, Agent, or Firm*—Perkins Coie LLP (57) ABSTRACT

A microelectronic device and method for manufacture. In one embodiment, two microelectronic substrates are directly bonded to each other without an intermediate adhesive material. For example, each microelectronic substrate can include a first surface, a second surface opposite the first surface, and a functional microelectronic feature coupled to a connection terminal of the microelectronic substrate. The connection terminals can be coupled to a support member, such as a leadframe or a printed circuit board, with the bond plane between the microelectronic substrates either aligned with or transverse to the support member. The microelectronic substrates can be enclosed in a protective packaging material that can include a transparent window to allow selected radiation to strike one or the other of the microelectronic substrates.

18 Claims, 4 Drawing Sheets

U.S. PATENT DOCUMENTS

| | | | |
|---|---|---|---|
| 6,093,969 A * | 7/2000 | Lin | 257/777 |
| 6,100,594 A | 8/2000 | Fukui et al. | |
| 6,121,676 A | 9/2000 | Solberg | |
| 6,124,634 A * | 9/2000 | Akram et al. | 257/698 |
| 6,153,924 A | 11/2000 | Kinsman | |
| 6,154,366 A | 11/2000 | Ma et al. | |
| 6,157,080 A | 12/2000 | Tamaki et al. | |
| 6,160,718 A | 12/2000 | Vakilian | |
| 6,175,149 B1 | 1/2001 | Akram | |
| 6,212,767 B1 | 4/2001 | Tandy | |
| 6,221,682 B1 * | 4/2001 | Danziger et al. | 438/15 |
| 6,222,265 B1 | 4/2001 | Akram et al. | |
| 6,225,689 B1 | 5/2001 | Moden et al. | |
| 6,228,548 B1 | 5/2001 | King et al. | |
| 6,235,554 B1 | 5/2001 | Akram et al. | |
| 6,252,299 B1 * | 6/2001 | Masuda et al. | 257/686 |
| 6,258,623 B1 | 7/2001 | Moden et al. | |
| 6,261,865 B1 | 7/2001 | Akram | |
| 6,262,895 B1 | 7/2001 | Forthun | |
| 6,281,577 B1 | 8/2001 | Oppermann et al. | |
| 6,294,839 B1 * | 9/2001 | Mess et al. | 257/777 |
| 6,297,547 B1 | 10/2001 | Akram | |
| 6,303,981 B1 | 10/2001 | Moden | |
| 6,307,257 B1 * | 10/2001 | Huang et al. | 257/676 |
| 6,332,766 B1 * | 12/2001 | Thummel | 425/116 |
| 6,339,254 B1 | 1/2002 | Venkateshwaran et al. | |
| 6,340,846 B1 | 1/2002 | LoBianco et al. | |
| 6,404,046 B1 * | 6/2002 | Glenn et al. | 257/690 |
| 6,420,789 B1 | 7/2002 | Tay et al. | |
| 6,465,892 B1 * | 10/2002 | Suga | 257/777 |
| 6,472,758 B1 | 10/2002 | Glenn et al. | |
| 6,552,910 B1 | 4/2003 | Moon et al. | |
| 6,560,117 B2 | 5/2003 | Moon | |
| 6,674,159 B1 * | 1/2004 | Peterson et al. | 257/680 |
| 6,737,738 B2 | 5/2004 | Koh et al. | |
| 6,784,023 B2 | 8/2004 | Ball | |
| 6,794,749 B2 * | 9/2004 | Akram | 257/718 |
| 6,828,665 B2 | 12/2004 | Pu et al. | |
| 6,838,761 B2 | 1/2005 | Karnezos | |
| 6,847,109 B2 | 1/2005 | Shim | |
| 6,857,470 B2 | 2/2005 | Park et al. | |
| 2002/0004258 A1 | 1/2002 | Nakayama et al. | |
| 2002/0142515 A1 | 10/2002 | Wehrly | |
| 2004/0016939 A1 | 1/2004 | Akiba et al. | |
| 2004/0119152 A1 | 6/2004 | Karnezos et al. | |
| 2004/0227250 A1 | 11/2004 | Bolken et al. | |

OTHER PUBLICATIONS

"3-D IC Packaging." *3-D IC Packaging Industry News.* May 1998. http://www.semiconductor.net/semiconductor/archive/May98/docs/ind_news2.html (Dec. 30, 1999).

Plößl, A. and Kräuter, G., "Wafer direct bonding: tailoring adhesion between brittle materials," *Materials Science and Engineering* R25(1-2): pp. 1-88, 1999.

* cited by examiner

MULTIPLE SUBSTRATE MICROELECTRONIC DEVICES AND METHODS OF MANUFACTURE

TECHNICAL FIELD

This invention relates to microelectronic devices having multiple substrates and methods for manufacturing such microelectronic devices.

BACKGROUND OF THE INVENTION

Microelectronic devices, such as memory chips and microprocessor chips, typically include a microelectronic substrate die encased in a plastic, ceramic or metal protective covering. The die includes functional features, such as memory cells, processor circuits, and interconnecting circuitry. The die also typically includes bond pads electrically coupled to the functional features. The bond pads are coupled to terminals, such as pins, that extend outside the protective covering for connecting to buses, circuits and/or other microelectronic devices.

Conventional microelectronic devices are typically arranged side-by-side on a circuit board or other support device that is incorporated into a computer, mobile phone or other larger electronic product. One drawback with this arrangement is that the circuit board may have a large surface area to accommodate a large number of microelectronic devices. Accordingly, it may be difficult to fit the circuit board into a housing of a compact electronic product.

One approach to address this problem is to stack one microelectronic die on top of another to reduce the surface area occupied by the dies. Typically, the stacked microelectronic dies are connected to each other with an intermediate adhesive layer that is heat cured to securely bond the dies to each other. However, the adhesive can have several drawbacks. For example, at high temperatures, the adhesive can emit gases that leave deposits on the bond pads of dies. The deposits can inhibit secure electrical connections between the bond pads and the terminals of the die. Another drawback is that the adhesive layer can have a different coefficient of thermal expansion than the dies to which it is attached. Accordingly, the adhesive layer can put stresses on the dies as the ambient temperature changes. In some cases, these stresses can crack or fracture the dies.

SUMMARY OF THE INVENTION

The present invention is directed toward compound microelectronic devices and methods for manufacturing compound microelectronic devices. A method in accordance with one aspect of the invention includes forming a first microelectronic substrate having a first surface, a second surface opposite the first surface, a first operable microelectronic device, and a first connection terminal coupled to the first microelectronic device. The method further includes forming a second microelectronic substrate having a first surface, a second surface opposite the first surface, a second operable microelectronic device, and a second connection terminal coupled to the second microelectronic device. The first and second microelectronic substrates are bonded together by placing the second surface of the second microelectronic substrate directly against the first or second surface of the first microelectronic substrate.

In a further aspect of the invention, the method can further include selecting the first and second microelectronic substrates to include microelectronic dies separated from one or more microelectronic wafers. Alternatively, when the first and second substrates are microelectronic wafers, the method can further include separating the wafers into bonded pairs of dies after bonding the wafers together.

The invention is also directed toward a compound microelectronic device. In one aspect of the invention, the compound microelectronic device can include a first microelectronic substrate having a first surface, a second surface opposite the first surface, a first functional or operable microelectronic feature or device, and a first connection terminal coupled to the first microelectronic feature or device. The compound device can further include a second microelectronic substrate having a first surface, a second surface opposite the first surface, a second functional or operable microelectronic feature or device, and a second connection terminal coupled to the second feature or device. The second surface of the second microelectronic substrate is bonded directly to the first or second surface of the first microelectronic substrate.

In a further aspect of the invention, the compound device can include a conductive support member engaged with at least one of the microelectronic substrates and conductive couplings extending between the conductive support member and the connection terminal. In still a further aspect of the invention, the first and second microelectronic substrates can each include an intermediate surface between the first and second surfaces, and the connection terminals of the substrates can be positioned on the intermediate surfaces. The compound device can further include a support member and the microelectronic substrates can be coupled to the support member as a unit with the first and second connection terminals electrically coupled to the support member and with the intermediate surfaces of the microelectronic substrates facing toward the support member.

In yet another aspect of the invention, the compound device can include a packaging material encapsulating the microelectronic substrates in a single enclosure. When one of the microelectronic substrates includes an imaging device, the enclosure can include a lens at least partially transparent to a selected radiation and positioned proximate to the imaging device to allow the radiation to pass to the imaging device.

DETAILED DESCRIPTION

The present disclosure describes microelectronic devices and methods for forming such devices. Many specific details of certain embodiments of the invention are set forth in the following description and in FIGS. 1-7 to provide a thorough understanding of these embodiments. One skilled in the art, however, will understand that the present invention may have additional embodiments, or that the invention may be practiced without several of the details described below.

Figure 1:
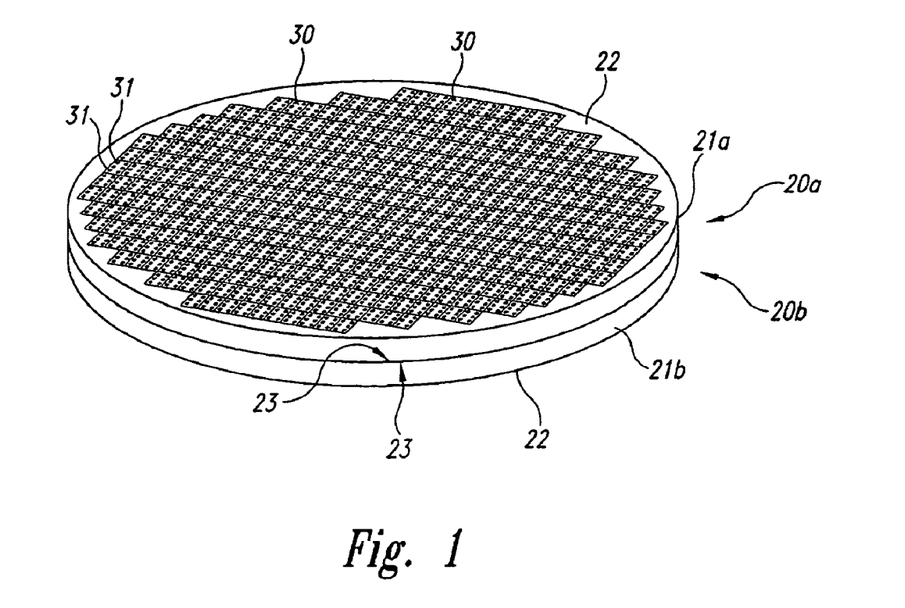
FIG. 1 is a top isometric view of two microelectronic substrate wafers bonded to each other in accordance with an embodiment of the invention.

FIG. 1 is a top isometric view of a first microelectronic substrate 20a bonded to a second microelectronic substrate 20b (referred to collectively as "microelectronic substrates 20") in accordance with one embodiment of the invention. In one aspect of this embodiment, the first microelectronic substrate 20a includes a first wafer 21a and the second microelectronic substrate 20b includes a second wafer 21b (referred to collectively as "wafers 21"). The wafers 21 can include silicon or another suitable substrate material. Each wafer 21 has a first surface 22 and a second surface 23 opposite the first surface. The wafers 21 each have a plurality of operable microelectronic devices, such as memory devices, processors, and/or other microelectronic devices arranged to form separable, stand-alone dies 30. For example, when the microelectronic devices are memory devices, the dies 30 can have memory capacity of 128 megabits or more. Each die 30 has one or more connection terminals 31 at the first surface 22 for coupling to other dies or devices. The dies 30 shown in FIG. 1 have six connection terminals 31, but can have more or fewer connection terminals in other embodiments.

The wafers 21 are bonded directly to each other by a technique commonly referred to as "wafer direct bonding." This technique is described by Andreas Ploessl and Gertrude Krauter in an article entitled "Wafer Direct Bonding: Tailoring Adhesion Between Brittle Materials," Materials Science and Engineering, R25 (1999) at 1-88 (Elsevier Science S.A.), which is incorporated by reference herein in its entirety. Accordingly, the second surfaces 23 of each wafer 21 are planarized, polished or otherwise processed to be extremely flat. The second surfaces 23 are then brought into contact with each other and directly bonded by attractive forces between the wafers 21 without requiring an intermediate adhesive. In one aspect of this embodiment, the temperature and/or pressure of the wafers 21 can be elevated while the second surfaces 23 are in contact with each other to strengthen the bond between the wafers 21. Alternatively, the wafers 21 can be attached without elevated pressure or temperature. In either embodiment, the bond between the wafers 21 can be extremely strong and can equal the bulk strength of the material comprising the wafers 21.

Figure 2:
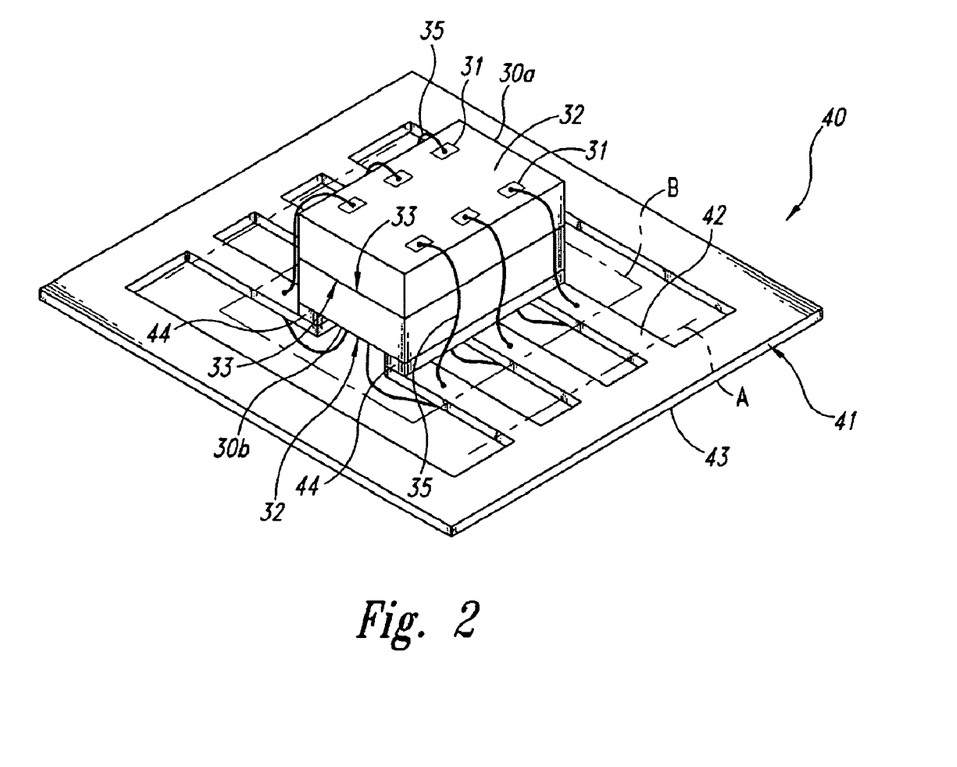
FIG. 2 is a top isometric view of two dies separated from the wafers shown in FIG. 1 and mounted to a support member in accordance with an embodiment of the invention.

In one embodiment, the wafers 21 can be cut along the lines delineating the dies 30 after the wafers 21 are bonded to each other. Alternatively, the dies 30 can be separated from each other before bonding the wafers 21 together, and pairs of the individual dies 30 can be bonded together using the direct bonding technique described above. In either embodiment, the result (as shown in FIG. 2) is a first die 30a bonded directly to a second die 30b without an intermediate adhesive. Each die 30 has an outwardly facing first surface 32 (having the connection terminals 31), and a second surface 33 bonded directly to the corresponding second surface 33 of the adjacent die 30.

In one aspect of the embodiment shown in FIG. 2, the dies 30 are mounted to a conductive support 40 to provide connections between the dies 30 and other devices. The conductive support 40 can include a leadframe 41 having an outer ring 43 with leadfingers 42 that extend inwardly toward the dies 30. The second die 30b can be mounted to the leadfingers 42 with adhesive strips 44 that extend along opposing edges of the second die 30b. Alternatively, each leadfinger 42 can be bonded to the second die 30b with an individual portion of adhesive. In either of these embodiments, the dies 30 are then electrically connected to the leadframe 41 by connecting wire bonds 35 between the connection terminals 31 of the dies 30 and the leadfingers 42 of the leadframe 41. In an alternate arrangement, the dies 30 can be inverted as a unit so the first die 30a is mounted to the leadfingers 42 with the adhesive strips 44. The connection terminals 31 of both dies 30 can be connected to the same leadfingers 42 as shown in FIG. 2 or alternatively, the connection terminals 31 of the first die 30a and the connection terminals of the second die 30b can be connected to different leadfingers 42.

Figure 3:
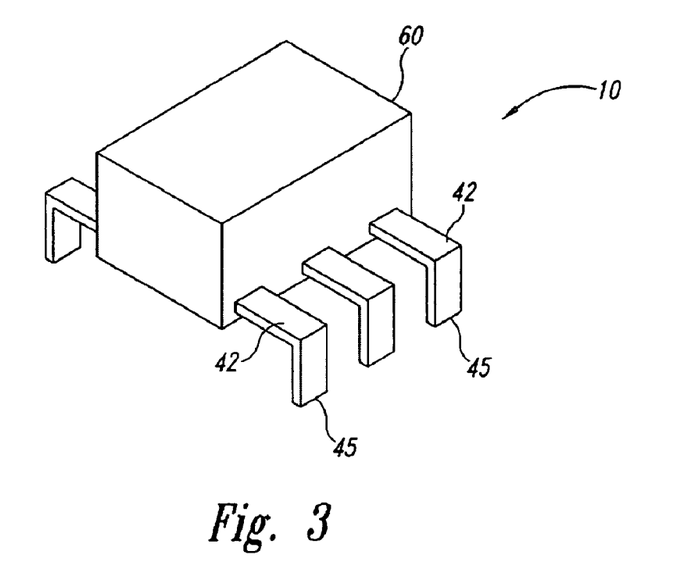
FIG. 3 is a side isometric view of a packaged device formed from the dies shown in FIG. 2 in accordance with an embodiment of the invention.

Next, the outer ring 43 can be separated from the leadfingers 42 by cutting the leadframe 42 along line "A." A protective coating is disposed around the dies 30 and the leadfingers 42 up to line "B." The protective coating can be applied in accordance with one or more known techniques, such as pouring a liquid epoxy directly over the dies 30, placing the dies 30 in a cavity and injecting epoxy into the cavity, or placing the dies within a pre-formed package. In any of these embodiments, the protective coating forms a package enclosure 60, shown in FIG. 3, that protects the dies 30 from contaminants and contact with other devices. The leadfingers 42 can be bent downwardly (as shown in FIG. 3) or upwardly to forms pins 45 for connecting the resulting packaged compound microelectronic device 10 to other devices and/or other circuits (not shown).

One feature of the processes and devices described above with reference to FIGS. 1-3 is that the dies 30 are bonded directly to each other without an intermediate adhesive layer. By eliminating the adhesive layer, this embodiment is expected to eliminate contamination caused by outgassing of an intermediate layer. Furthermore, some conventional adhesives used to bond the dies 30 have a different coefficient of thermal expansion than the dies 30 and may crack the dies 30 at elevated temperatures. Accordingly, eliminating the adhesive is expected to eliminate this potential source of damage to the dies 30. Yet another advantage is that the packaged microelectronic device 10 will be shorter (in the vertical direction, as shown in FIGS. 1-3) than a conventional packaged device because the thickness of the adhesive is eliminated. Accordingly, the microelectronic device 10 can more easily be placed in locations having limited vertical clearance. Still another advantage is that the first surfaces 32 of the dies 30 are more likely to be parallel to each other and to the conductive support 40 when the dies are directly bonded to each other. This advantage can be particularly important when one or more of the dies 30 has optical features, as will be discussed in greater detail below with reference to FIG. 7.

Figure 4:
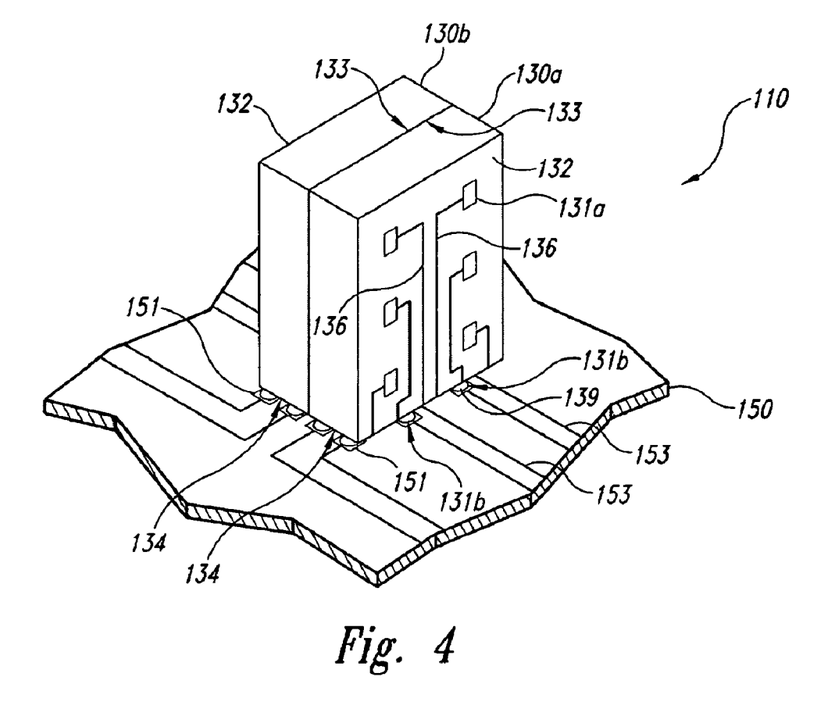
FIG. 4 is a top isometric view of two bonded dies edge-mounted to a support member in accordance with another embodiment of the invention.

FIG. 4 is a top isometric view of a compound microelectronic device 110 in accordance with another embodiment of the invention. The microelectronic device 110 includes a first die 130a bonded to a second die 130b (referred to collectively as dies 130), either before or after the dies 130 are separated from corresponding wafers 21 (FIG. 1). Each die 130 has an outwardly facing first surface 132, an inwardly facing second surface 133 and an intermediate surface 134 between the first surface 132 and the second surface 133. The second surface 133 of the first die 130a is bonded to the corresponding second surface 133 of the second die 130b without an intermediate adhesive in a manner generally similar to that discussed above with reference to FIG. 1.

The first surface 132 of each die 130 includes a plurality first connection terminals 131a and the intermediate surface 134 of each die 130 includes one or more second connection terminals 131b electrically coupled to the first connection terminals 131a with couplings 136. In one aspect of this embodiment, the first connection terminals 131a are connected to the second connection terminals 131b when the die or the wafer is fabricated. Alternatively, the first connection terminals 131a can be connected to the second connection terminals after fabrication. In still another embodiment, the first connection terminals 131a can be eliminated and the functional microelectronic features within the dies 130 can be connected directly to the second connection terminals 131b positioned on the intermediate surface 134 of the dies 130.

In any of the above embodiments discussed with reference to FIG. 4, the dies 130 are positioned on a support member 150 with the intermediate surfaces 134 facing the support member 150 and the second surfaces 133 extending transversely away from the support member 150. The support member 150 can include connection sites for connecting to the second connection terminals 131b of the dies 130. For example, when the second connection terminals 131b include solder balls 139, the support member 150 can include solder pads 151 aligned with the solder balls 139. The solder pads 151 are connected to leads 153 for coupling the dies 130 to other devices. Alternatively, the device 110 can include other arrangements for coupling the second connection terminals 131b to the support member 150. In either embodiment, the device 110 can include an enclosure surrounding the dies 130 in a manner similar to that discussed above with reference to FIG. 3, or the device 110 can be coupled to the support member 150 without an enclosure.

One feature of the compound microelectronic device 110 discussed above with reference to FIG. 4 is that the dies 130 are rotated 90 degrees relative to the dies 30 discussed above with reference to FIGS. 1-3 before they are attached to the support member 150. Accordingly, the intermediate surfaces 134 of the dies 130 face the support member 150. An advantage of this feature is that the dies 130 may take up less surface area of the support member than the dies 30 discussed above with reference to FIGS. 1-3.

Figure 5:
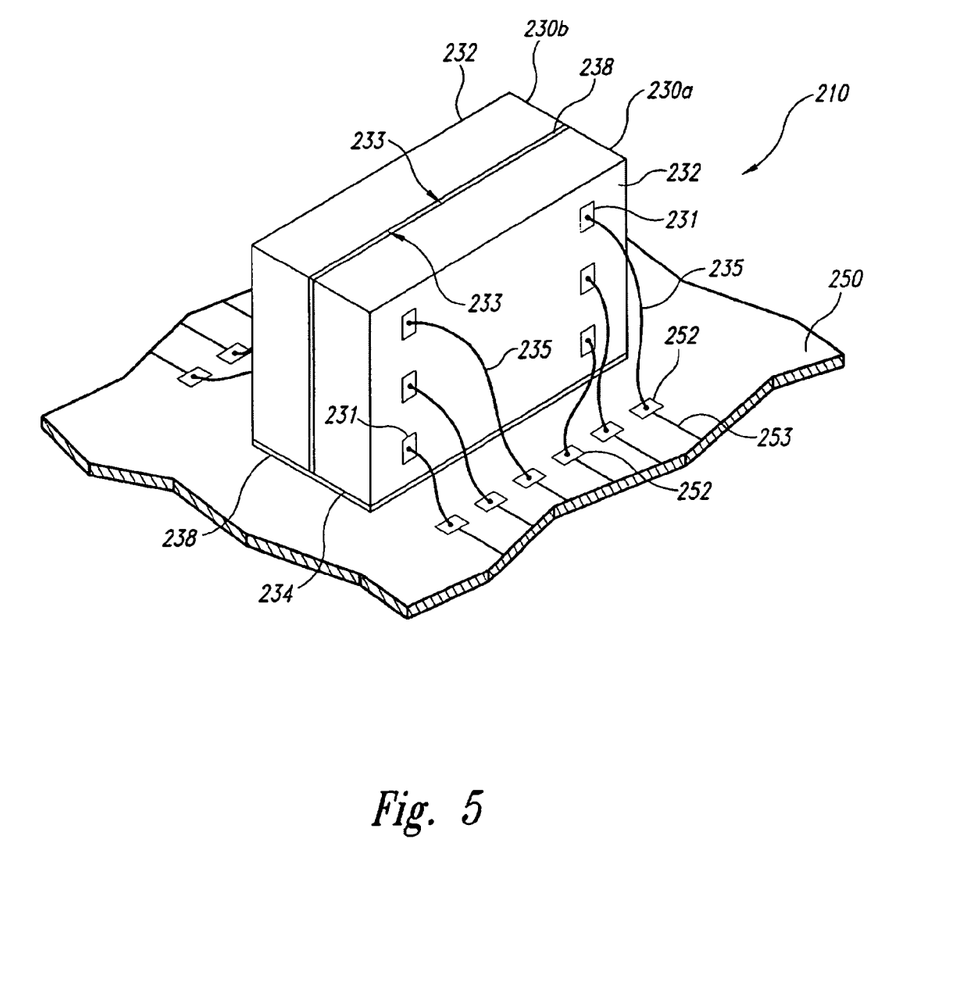
FIG. 5 is a side isometric view of two dies edge-mounted to a support member in accordance with still another embodiment of the invention.

FIG. 5 is a top isometric view of a compound microelectronic device 210 that includes a first die 230a coupled to a second die 230b, both of which are coupled to a support member 250 in accordance with another embodiment of the invention. Each die 230 includes an outwardly facing first surface 232 having connection terminals 231, an inwardly facing second surface 233, and an intermediate surface 234 between the first and second surfaces. In one aspect of this embodiment, the second surfaces 233 of each of the dies 230 are bonded to each other with a die adhesive layer 238a that extends between the two dies 230. Alternatively, the dies 230 can be directly bonded in a manner similar to that discussed above with reference to FIGS. 1-4. In either embodiment, the device 210 can include a support adhesive layer 238b that extends between the support member 250 and the intermediate surfaces 234 of the dies 230 to bond the dies 230 to the support member 250. Alternatively, the intermediate surfaces 234 of the dies 230 can also include solder balls generally similar to those discussed above with reference to FIG. 4 connected to the support member 250. The support member 250 includes support member pads 252 connected to the connection terminals 231 of the dies 230 by wire bonds 235. The support member pads 252 can be coupled to other devices with leads 253.

One feature of the compound device 210 discussed above with reference to FIG. 5 is that the dies 230 are connected to each other with an adhesive layer 238a. Accordingly, an advantage of the device 210 is that the second surfaces 233 of the dies 230 need not be made as flat as the corresponding directly bonded surfaces discussed above with reference to FIGS. 1-4. Conversely, an advantage of the directly bonded substrates discussed above with reference to FIGS. 1-4 is that the adhesive layer 238a is eliminated to reduce the likelihood of contaminating and/or cracking the dies.

Another feature of the compound device 210 shown in FIG. 5 is that the connection terminals 231 are bonded directly to the support member pads 252 without the need for intermediate connection terminals on the intermediate surface 234 of the dies 230. An advantage of this feature is that it can eliminate the fabrication process required to provide the additional connection terminals. Conversely, an advantage of the arrangement discussed above with reference to FIG. 4 is that it may be easier to connect terminals that face directly toward each other than to connect terminals that do not directly face each other.

Figure 6:
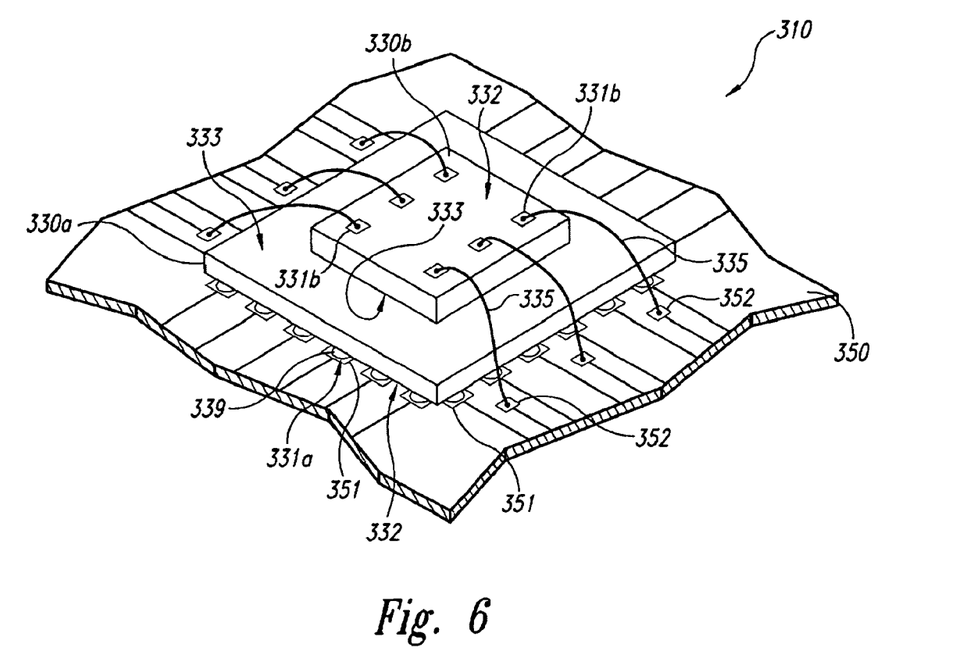
FIG. 6 is a top isometric view of two dies bonded to each other and mounted to a support member in accordance with still another embodiment of the invention.

FIG. 6 is a top isometric view of a compound microelectronic device 310 having a first die 330a and a second die 330b coupled to a support member 350 in accordance with another embodiment of the invention. In one aspect of this embodiment, the first die 330a has a first surface 332 facing downwardly toward the support member 350 and a second surface 333 facing upwardly toward the second die 330b. The second die 330b has an upwardly facing first surface 332 and a downwardly facing second surface 333 bonded to the second surface 333 of the first die 330a in accordance with any of the direct bonding processes discussed above with reference to FIGS. 1-3.

In a further aspect of this embodiment, the first die 330a has first connection terminals 331a in the form of solder balls 339 that are bonded to corresponding solder pads 351 of the support member 350. The second die 330b has second connection terminals 331b in the form of bond pads that are coupled to corresponding support member pads 352 with wire bonds 335. The second die 330b can have a planform shape that is smaller than the planform shape of the first die 330a (as shown in FIG. 6). For example, the first die 330a can include an SRAM device and the second die 330b can include a flash memory device. Alternatively, the second die 330b can have a planform shape that is the same as or larger than the planform shape of the first die 330a. In either of these embodiments, an advantage of the device 310 compared to an embodiment of the device 10 discussed above with reference to FIGS. 1-3 is that it may be easier in some cases to bond the solder balls 339 to the solder pads 351 than to wire bond the connection terminals 31 to the leadframe 41.

Figure 7:
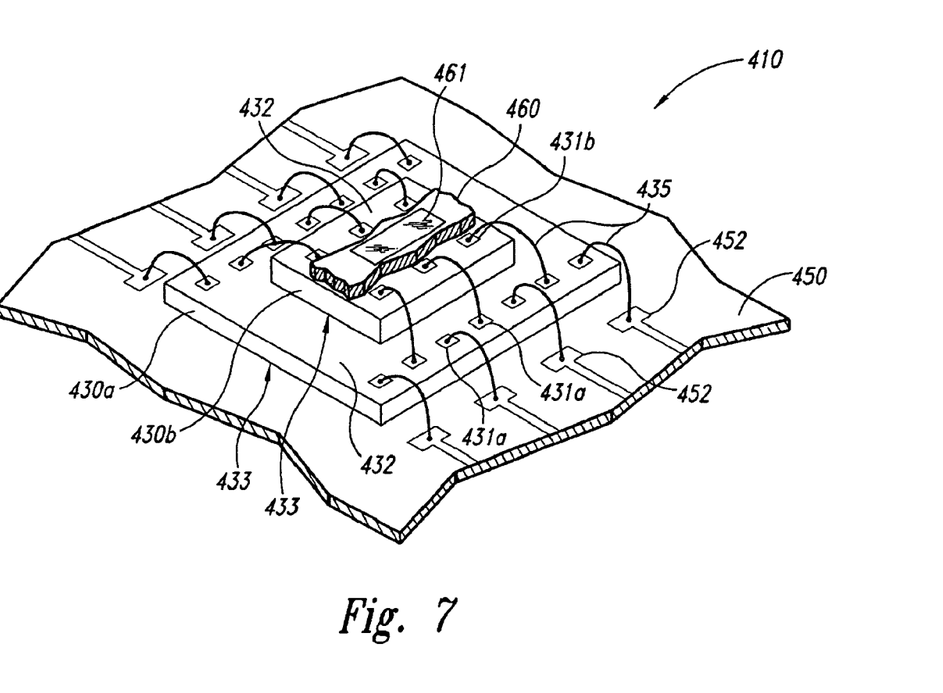
FIG. 7 is a top isometric view of two dies bonded and electrically coupled to each other in accordance with yet another embodiment of the invention.

FIG. 7 is a top isometric view of a compound microelectronic device 410 having a first die 430a electrically coupled to a second die 430b and a support member 450 in accordance with yet another embodiment of the invention. In one aspect of this embodiment, each die 430 has an upwardly facing first surface 432 and a downwardly facing second surface 433 opposite the first surface 432. The first die 430a has first connection terminals 431a and the second die 430b has second connection terminals 431b. In a further aspect of this embodiment, the first and second connection terminals (collectively referred to as "connection terminals 431") can include wire bond pads on the upwardly facing first surfaces 432.

In one aspect of the embodiment shown in FIG. 7, the second surface 433 of the second die 430b is directly bonded to the first surface 432 of the first die 430a using a method generally similar to that discussed above with reference to FIGS. 1-3. For example, when the first surface 432 of the first die 430a includes a passivation layer, the passivation layer and the second surface 433 of the second die 430b are planarized, polished or otherwise processed to be extremely flat. In another aspect of this embodiment, at least some of the second connection terminals 431b of the second die 430b are connected directly to corresponding first connection terminals 431a of the first die 430a. At least some of the first connection terminals 431a of the first die 430a are connected to support member pads 452 on the support member 450 using wire bonds 435. Such an arrangement may be suitable where it is advantageous to minimize the lengths of the electrical paths between the first die 430a and the second die 430b. For example, when the first die 430a is a processor and the second die 430b includes an imaging device, the direct connection between the two dies 430 can increase the speed and timing accuracy with which signals are transmitted between the processor and the imaging device.

In still another aspect of the embodiment shown in FIG. 7, the device 410 can include a package enclosure 460, a portion of which is shown in FIG. 7. In one aspect of this embodiment (for example, when the second die 430b includes an imaging device), the package enclosure 460 can include a lens 461 that transmits radiation to the second die 430b. Alternatively, the second die 430b can emit light and the lens 461 can focus light leaving the package enclosure 460. In either embodiment, the package enclosure 460 can be pre-formed so that the lens 461 is parallel to the support member 450. Accordingly, a feature of directly bonding the second die 430b to the first die 430a is that it is more likely that the second die 430b will remain parallel to the support member 450 and, therefore, parallel to the lens 461. This feature is advantageous because if the second die 430b is not parallel to the lens 461, the device 410 may not operate properly because the lens 461 may not accurately focus radiation received by and/or emitted by the second die 430b.

From the foregoing it will be appreciated that, although specific embodiments of the invention have been described herein for purposes of illustration, various modifications may be made without deviating from the spirit and scope of the invention. For example, the operable microelectronic devices discussed above can include operable microelectronic components or features that combine to form the operable microelectronic devices, or that define standalone operable elements. Accordingly, the invention is not limited except as by the appended claims.

The invention claimed is:

1. A compound microelectronic device, comprising:
   a first singulated microelectronic die having a first surface, a second surface opposite the first surface, and a first connection terminal; and
   a second singulated microelectronic die having a first surface, a second surface opposite the first surface, and a second connection terminal, the second surface of the second microelectronic die and the first surface or the second surface of the first microelectronic die both including a semiconductor material and being planarized, polished, or otherwise processed to be flat enough so that the semiconductor material of the second surface of the second microelectronic die is bonded directly to the semiconductor material of the first surface or the second surface of the first microelectronic die by attractive forces between the semiconductor material of the first singulated microelectronic die and the semiconductor material of the second singulated microelectronic die and without an adhesive between the second surface of the second singulated microelectronic die and the first surface or the second surface of the first microelectronic die.

2. The device of claim 1, further comprising a single packaging enclosure surrounding both the first and second microelectronic dies with the first and second microelectronic dies being the only microelectronic dies within the enclosure.

3. The device of claim 2 wherein the enclosure conforms to the shapes of the first and second microelectronic dies.

4. The device of claim 1 wherein the first microelectronic die includes a memory device.

5. The device of claim 1 wherein the first microelectronic die includes a memory device having at least 128 megabits of memory.

6. The device of claim 1, further comprising:
   a conductive support member engaged with at least one of the microelectronic dies;
   a first conductive coupling extending between the conductive support member and the first connection terminal; and
   a second conductive coupling extending between the conductive support member and the second connection terminal.

7. The device of claim 1 wherein the second surface of the second microelectronic die is bonded to the second surface of the first microelectronic die.

8. The device of claim 7 wherein the first microelectronic die has an intermediate surface between and transverse to the first and second surfaces thereof, further wherein the first connection terminal is positioned on the intermediate surface of the first microelectronic die.

9. The device of claim 1 wherein the second surface of the second microelectronic die is bonded to the first surface of the first microelectronic die.

10. The device of claim 1 wherein the first connection terminal includes a first wire bond pad and the second connection terminal includes a second wire bond pad.

11. The device of claim 1 wherein the first connection terminal includes a solder ball and the second connection terminal includes a conductive wire bond pad.

12. A compound microelectronic device, comprising:
   a first singulated microelectronic die having a first surface with a first connection terminal and a second surface opposite the first surface;
   a second singulated microelectronic die having a first surface with a second connection terminal and a second surface opposite the first surface, the second surface of the first microelectronic die and the second surface of the second microelectronic die both including a semiconductor material and being planarized, polished, or otherwise processed to be flat enough so that the semiconductor material of the second surface of the first microelectronic die is directly bonded to the semiconductor material of the second surface of the second microelectronic die when in direct contact by attractive forces between the semiconductor material of the first microelectronic die and the semiconductor material of the second microelectronic die and without an adhesive between the second surface of the second singulated microelectronic die and the first surface or the second surface of the first microelectronic die;
   a conductive support member engaged with at least one of the microelectronic dies;

a first conductive coupling extending between the conductive support member and the first connection terminal;

a second conductive coupling extending between the conductive support member and the second connection terminal; and a packaging material encapsulating the first and second microelectronic dies in a single capsule.

13. The device of claim 12 wherein the packaging material includes a conformal coating surrounding both microelectronic dies.

14. The device of claim 12 wherein the first conductive coupling includes a length of wire between the support member and the first connection terminal.

15. The device of claim 12, further comprising a layer of adhesive between the support member and at least one of the first and second microelectronic dies.

16. A compound microelectronic device, comprising:

a first singulated microelectronic substrate having a first surface, a second surface opposite the first surface, and a first connection terminal, the first microelectronic substrate including at least one operable microelectronic die; and a second singulated microelectronic substrate having a first surface, a second surface opposite the first surface and a second connection terminal, the second microelectronic substrate including at least one operable microelectronic die, the second surface of the second microelectronic substrate and the first surface or the second surface of the first microelectronic substrate both including a semiconductor material and being planarized, polished, or otherwise processed to be flat enough so that the semiconductor material of the second surface of the second microelectronic substrate is bonded directly to the semiconductor material of the first surface or the second surface of the first microelectronic substrate by attractive forces between the semiconductor material of the two substrates and without an adhesive between the two substrates.

17. The compound microelectronic device of claim 16 wherein the first microelectronic substrate includes a first singulated microelectronic die and the second microelectronic substrate includes a second singulated microelectronic die.

18. The compound microelectronic device of claim 16 wherein the first microelectronic substrate includes a first wafer having a plurality of unsingulated microelectronic dies and the second microelectronic substrate includes a second wafer having a plurality of unsingulated microelectronic dies.

* * * * *